United States Patent [19]
Sumi et al.

[11] Patent Number: 5,866,818
[45] Date of Patent: Feb. 2, 1999

[54] ACCELERATION SENSOR DEVICE

[75] Inventors: Sadayuki Sumi; Shigenari Takami; Fumihiro Kasano; Naohiro Taniguchi; Kazuya Nohara, all of Kadoma, Japan

[73] Assignee: Matsushita Electric Works, Ltd., Osaka, Japan

[21] Appl. No.: 756,716

[22] Filed: Nov. 26, 1996

[51] Int. Cl.⁶ ..................................... G01P 15/12
[52] U.S. Cl. ................ 73/514.33; 73/493; 73/514.36
[58] Field of Search ............... 73/514.33, 514.36, 73/514.37, 493; 338/2, 5

[56] References Cited

U.S. PATENT DOCUMENTS

| | | | |
|---|---|---|---|
| 4,399,692 | 8/1983 | Hulsing, II et al. ................. | 73/151 |
| 5,239,870 | 8/1993 | Kaneko ................................. | 73/514.33 |
| 5,490,421 | 2/1996 | Ueyanagi .............................. | 73/514.33 |
| 5,528,935 | 6/1996 | Welch et al. ......................... | 73/493 |

*Primary Examiner*—John E. Chapman
*Attorney, Agent, or Firm*—Lynn & Lynn

[57] ABSTRACT

An acceleration sensor element constitutes a piezoresistance type acceleration sensor in which an acceleration sensor chip including a cantilever structure of mass and beam parts and a piezoresistor formed on the beam part is mounted on a main lead which is slanted for positioning the piezoresistor and the center of gravity of the mass part substantially on the same horizontal plane in a mounted state of the sensor. The element thereby improves the reliability and assures such property as other-axis sensitivity of the sensor at the time of shipment.

13 Claims, 20 Drawing Sheets

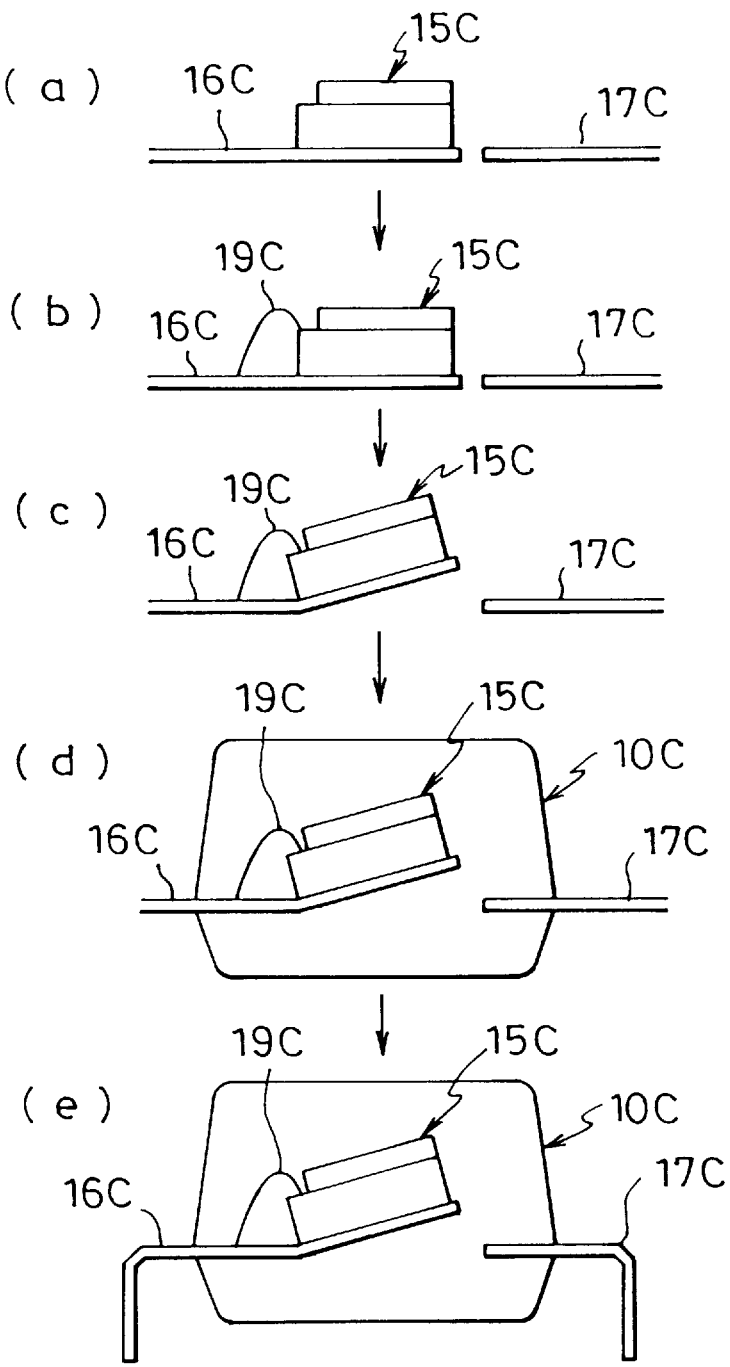

F I G. 31
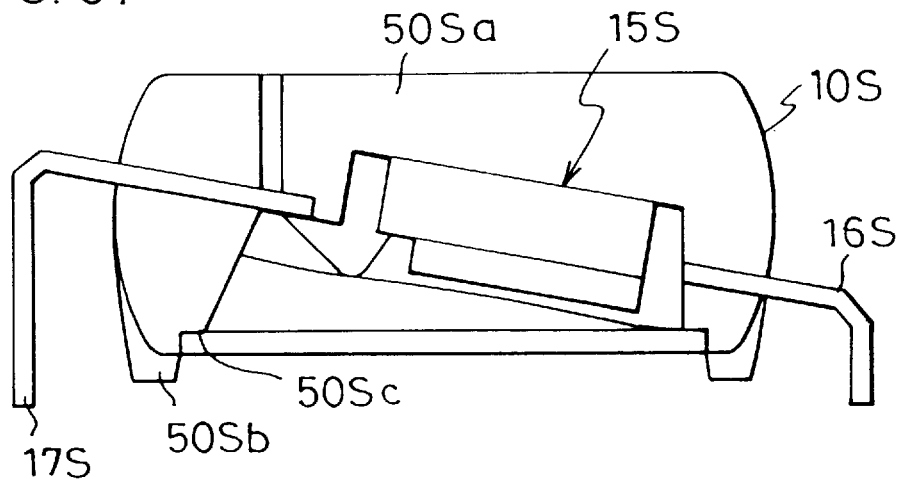
F I G. 32
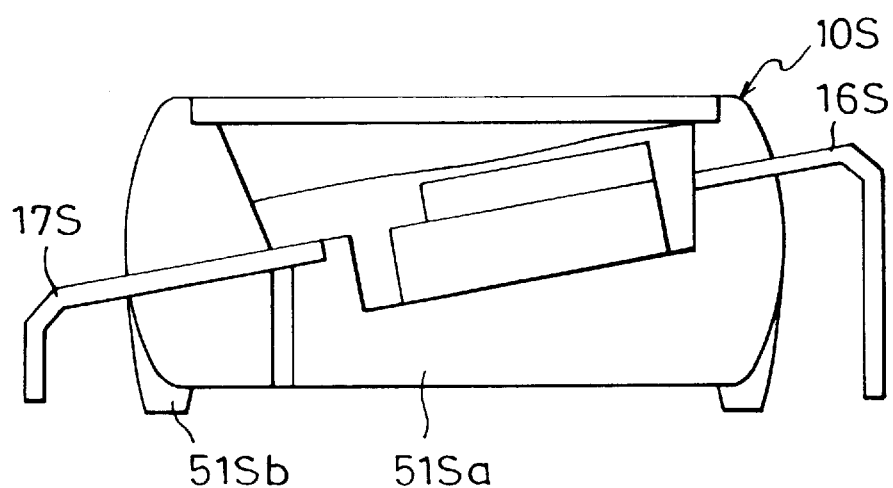
F I G. 33
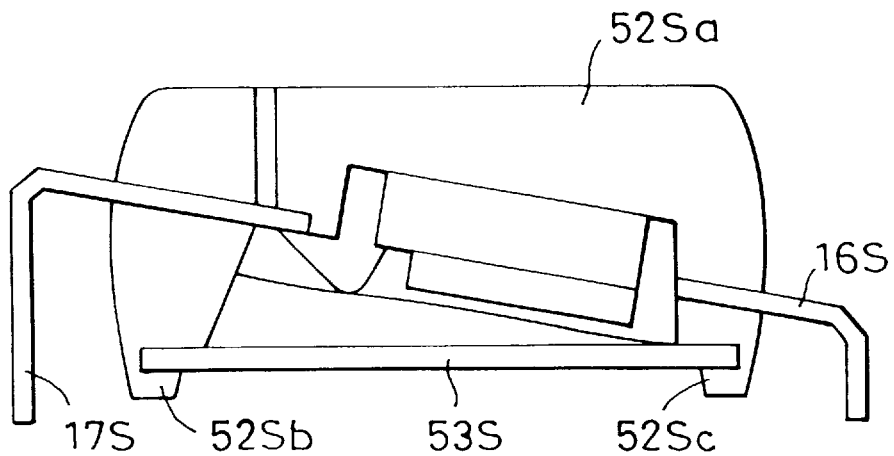

ACCELERATION SENSOR DEVICE

BACKGROUND OF THE INVENTION

This invention relates to an acceleration sensor device which senses the acceleration and outputs the sensed acceleration as an electric signal.

DESCRIPTION OF RELATED ART

Conventional semiconductor piezoresistance type acceleration sensor devices which have been employed as applied to safety air bags and so on are mostly merchandised in the form of a sensor module mounted on a circuit board performing a signal compensation for the output signal of the acceleration sensor chip in respect of offset voltage, offset temperature characteristics, sensitivity/temperature characteristics and so on, the signal compensation being performed by means of a trimming or the like. In the case of inexpensive sensor, the acceleration sensor chip may be merchandised by itself.

More specifically, the semiconductor piezoresistance type acceleration sensor device is constituted by an acceleration sensor chip which comprises a vibratory unit including a mass (weight) and a beam supporting the mass which are formed with a single crystal silicone substrate subjected to a micromachine technique applied, for example, and a piezoresistor formed on part of the beam to vary its resistance value upon application of a stress. Provided here that an acceleration is applied in a direction perpendicular to extending direction of the vibratory unit, the mass is caused to move due to its force of inertia to have the beam bent. A distortion occurred in the beam at this time causes the resistance value of the piezoresistor to vary, and the electric signal corresponding to the stress applied can be obtained. Further, the acceleration sensor device comprises a lower stopper made of a glass or silicon and supports the single crystal silicone substrate on its lower side to define a lower limit of the movement of the mass, and an upper stopper covering the upper side of the mass and beam to define an upper limit of the movement of the mass.

With regard to the disposition of the mass and beam, the thickness of the beam and so on in respect of the foregoing semiconductor piezoresistor acceleration sensor device, respective manufacturers have their own know-how and techniques, but, in the case of the acceleration sensor device of cantilevered structure, it is required to have the piezoresistor and the center of gravity of the mass positioned substantially on the same horizontal plane in order to reduce the other-axis (lateral) sensitivity. With reference to styles in which the semiconductor acceleration sensor devices of the cantilevered structure have been sold hereto, on the other hand, the sensor devices have been sold with the acceleration sensor chip kept in a state of not being slanted, and they are required to be mounted in a state in which the acceleration sensor chip is slanted.

In the case of such acceleration sensor devices commercialized in the state where the acceleration sensor chip is not slanted, therefore, there has been a risk that the reliability cannot be assured and a malfunction of the sensor is caused to occur.

For the prior art, there may be enumerated U.S. Pat. Nos. 4,399,692, 5,490,421 and 5,528,935, but there has been suggested no structure in which a mounting surface of the acceleration sensor chip with respect to the circuit board is slanted.

SUMMARY OF THE INVENTION

An object of the present invention is, therefore, to provide an acceleration sensor device which can eliminate the foregoing problems, and can improve the reliability and assure the property of commodity as the other-axis sensitivity upon shipment of the commodity.

The above object of the present invention can be realized by means of a sensor device of acceleration sensor in which an acceleration sensor chip including a mass, a beam supporting the mass in a cantilevered structure, and an acceleration detecting means provided on the beam is mounted on a main lead, characterized in that part of the main lead on which the acceleration sensor chip is mounted is slanted for positioning the acceleration detecting means and the center of gravity of the mass substantially on the same horizontal plane in mounted state of the sensor.

Other objects and advantages of the present invention shall be made clear in the following description of the invention detailed with reference to preferred embodiments shown in accompanying drawings.

BRIEF DESCRIPTION OF THE DRAWINGS

FIGS. 9(a) to 9(e) show in schematic sectioned views steps in one working aspect of the method for manufacturing the acceleration sensor device of the embodiment of FIG. 8 of the present invention;

FIGS. 29 to 33 are schematic sectioned views showing other embodiments of the acceleration sensor device according to the present invention.

Figure 1A:
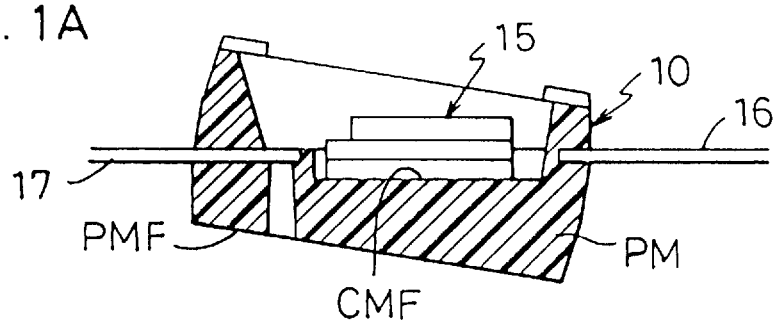
FIG. 1A is a schematic sectioned view of the acceleration sensor device according to the present invention.

While the present invention shall be described in the followings with reference to the preferred embodiments shown in the drawings, it should be appreciated that the intention is not to limit the subject invention only to these embodiments shown but rather to include all alterations, modifications and equivalent arrangement possible within the scope of appended claims.

DETAILED DESCRIPTION OF THE
PREFERRED EMBODIMENT

The acceleration sensor device in the various embodiments preferred as shown in the drawings according to the present invention shall now be described.

Figure 1B:
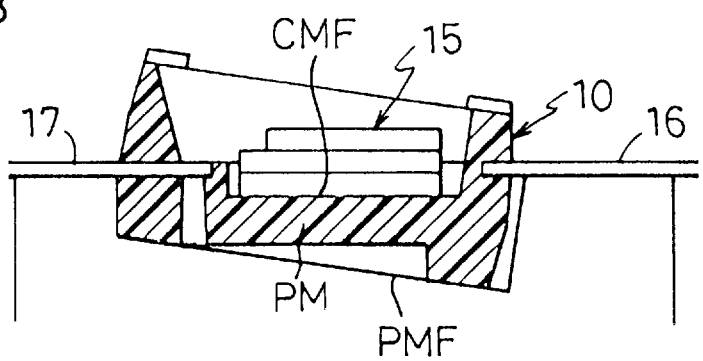
FIGS. 1B and 1C are sectioned views for explaining another aspect of the acceleration sensor device of FIG. 1A and of an acceleration sensor chip employed in the device, respectively.
Figure 1C:
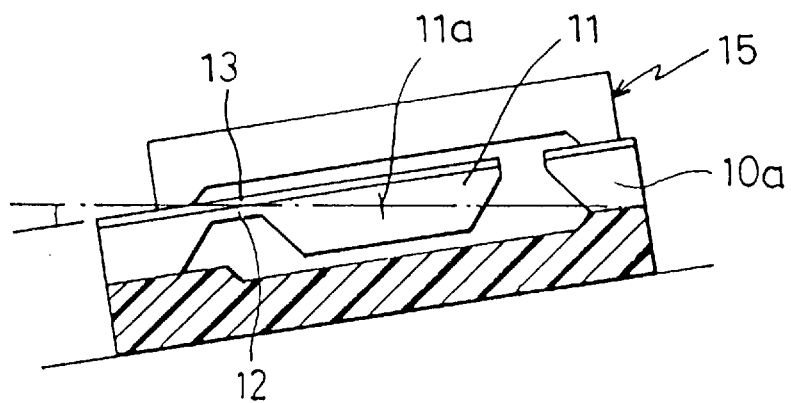

Referring to FIG. 1, there is shown an embodiment of the acceleration sensor device 10 according to the present invention, which includes an acceleration sensor chip 15 having a cantilevered structure of a mass 11 and a beam 12, as well as a piezoresistor 13 formed on the beam 12, respectively formed by means of a semiconductor etching technique, as shown in FIG. 1C.

This acceleration sensor chip 15 is die-bonded to a package body PM of a plastic molding, preferably with a resin material employed. In this case, as shown in FIG. 1A, the acceleration sensor device 10 is so constituted that a chip mounting surface CMF of the package body PM for the acceleration sensor chip 15 is slanted by a predetermined angle with respect to a package mounting surface PMF of the package body PM, the same as the bottom surface of the package body in the present instance, at which surface the package body PM as well as the entire sensor device 10 are to be mounted onto such a separate sensor-mounting object as a printed circuit board.

Further, the acceleration sensor device 10 includes a main lead on which the acceleration sensor chip 15 is mounted, and a second-pad side subsidiary lead 17 of the main lead 16, the subsidiary lead 17 being electrically connected to the piezoresistor 13 of the acceleration sensor chip 15 through a wire bonding by means of heating.

Figure 2:
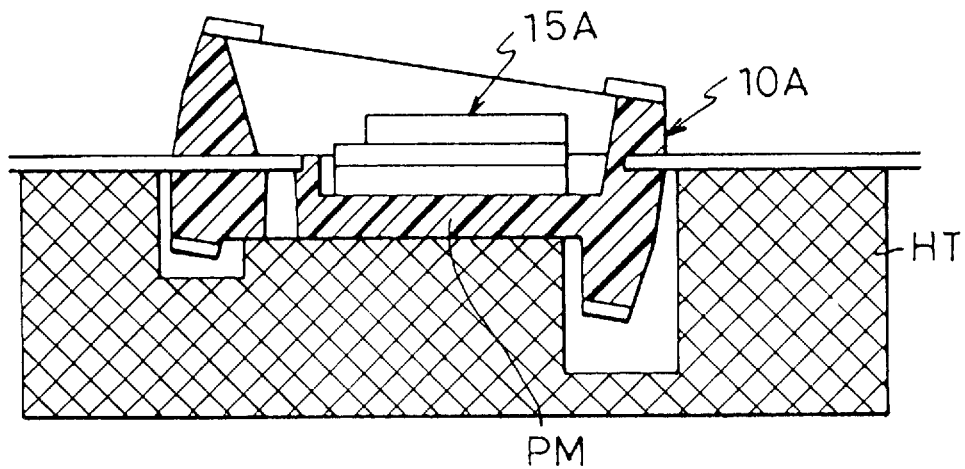
FIGS. 2 to 5 are explanatory views for other aspects of the acceleration sensor device of FIG. 1A.
Figure 3:
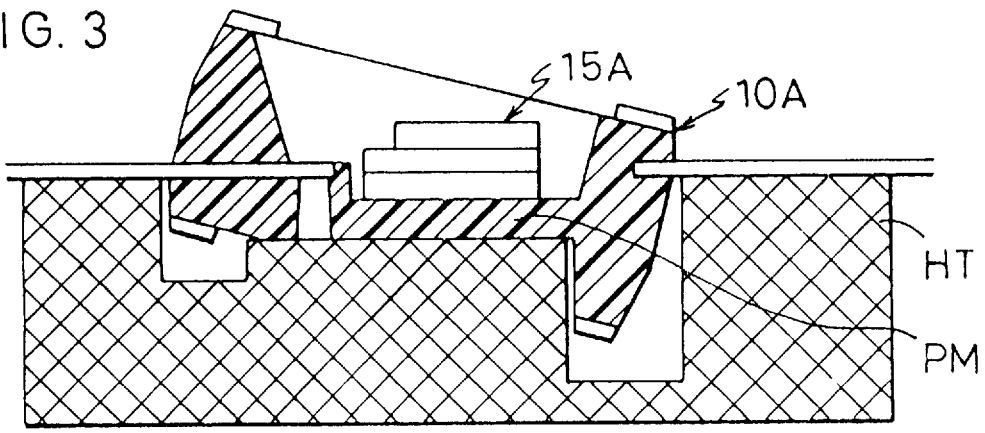
Figure 4:
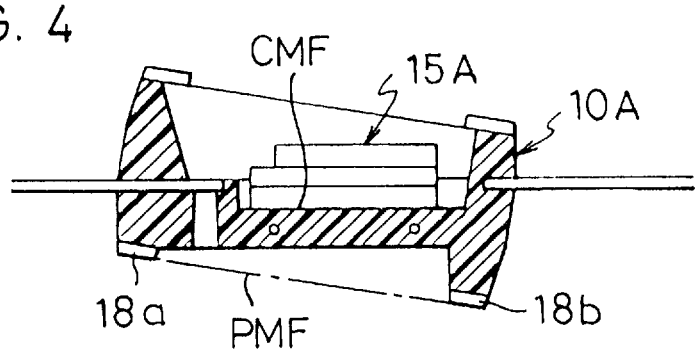
Figure 5:
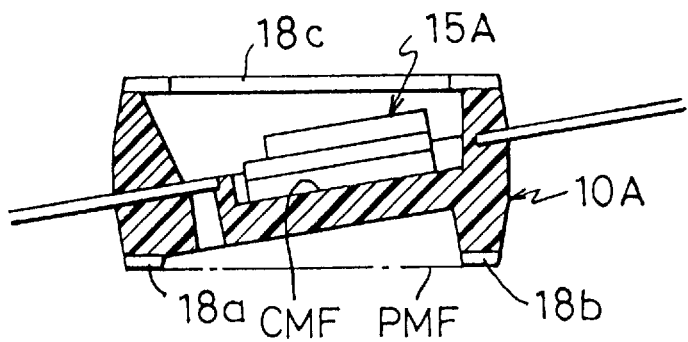

On the other hand, the slant of the chip mounting surface CMF with respect to the package mounting surface PMF should result in a difference in the distance between the bottom surface (=PMF) and each of the main and subsidiary leads 16 and 17, as seen in FIG. 1A. This difference is, further, not constant since it is required to modify the angle of slant of the acceleration sensor chip in accordance with a range for which the acceleration is to be sensed, so that measures will be required for unifying the heating with respect to both leads 16 and 17 as applied from the bottom surface upon carrying out the wire bonding. For this purpose, as shown in FIG. 1B, a heating recess having a surface parallel to the chip mounting surface CMF is provided in the bottom which forms the package mounting surface PMF of the package body PM, so that the thickness of the package body on the bottom side with respect to both leads 16 and 17 will be uniform, and uniform heating is made thereby attainable with a wire bonding heater HT engaged in the recess, while allowing uniform heating to be achieved with the same heater HT used throughout both types of the acceleration sensor device for a lower range of acceleration with a smaller slant as shown in FIG. 2 and for a higher range of acceleration with a larger slant as shown in FIG. 3, so that production of the acceleration sensor device can be improved in efficiency. In this case, it is also possible to optimally constitute both types of the acceleration sensor devices with the smaller slant of FIG. 2 and with the larger slant of FIG. 3, by providing projections 18a and 18b at both end portions of the bottom of the package body PM in slanting direction of the chip mounting surface CMF as shown in FIG. 4, and varying relative height relationship between both of the projections 18a and 18b while maintaining the parallel relationship between the chip mounting surface CMF and the bottom surface in the heating recess. In addition, the provision of the projections 18a and 18b can contribute to positioning of a lid 18c mounted to a top side of the package body PM as shown in FIG. 5. In this way, it is enabled to render the mounting to the board to be sufficiently smooth and easy, and to be contributive to the improvement in the productivity. In FIGS. 2 to 5, the same elements as those shown in FIG. 1 are denoted by the same reference numerals but with a suffix "A" added, and they also function the same way.

Figure 6:
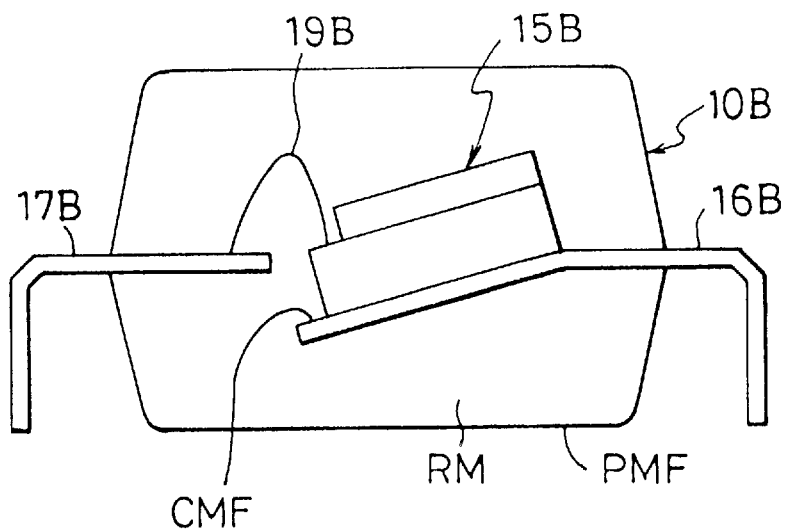
FIG. 6 is a schematic sectioned view of the acceleration sensor device in another embodiment according to the present invention.

In FIG. 6, there is shown another embodiment of the present invention, in which the main lead 16B is bent to be slanted downward at inward end portion on which the acceleration sensor chip 15B is die-bonded is bent downward to be slanted to have the piezoresistor 13 and the center 11a of gravity of the mass 11 positioned substantially on the same horizontal plane, as shown in FIG. 1C. The package mounting surface PMF of the package body PM is formed to be substantially parallel to the plane of outer portions of the main and subsidiary leads 16B and 17B, so that the acceleration sensor chip 15B can be mounted for positioning the piezoresistor 13 and the center 11a of gravity of the mass 11 substantially on the same horizontal plane by mounting the device 10B with the surface PMF engaged to the board.

Figure 7:
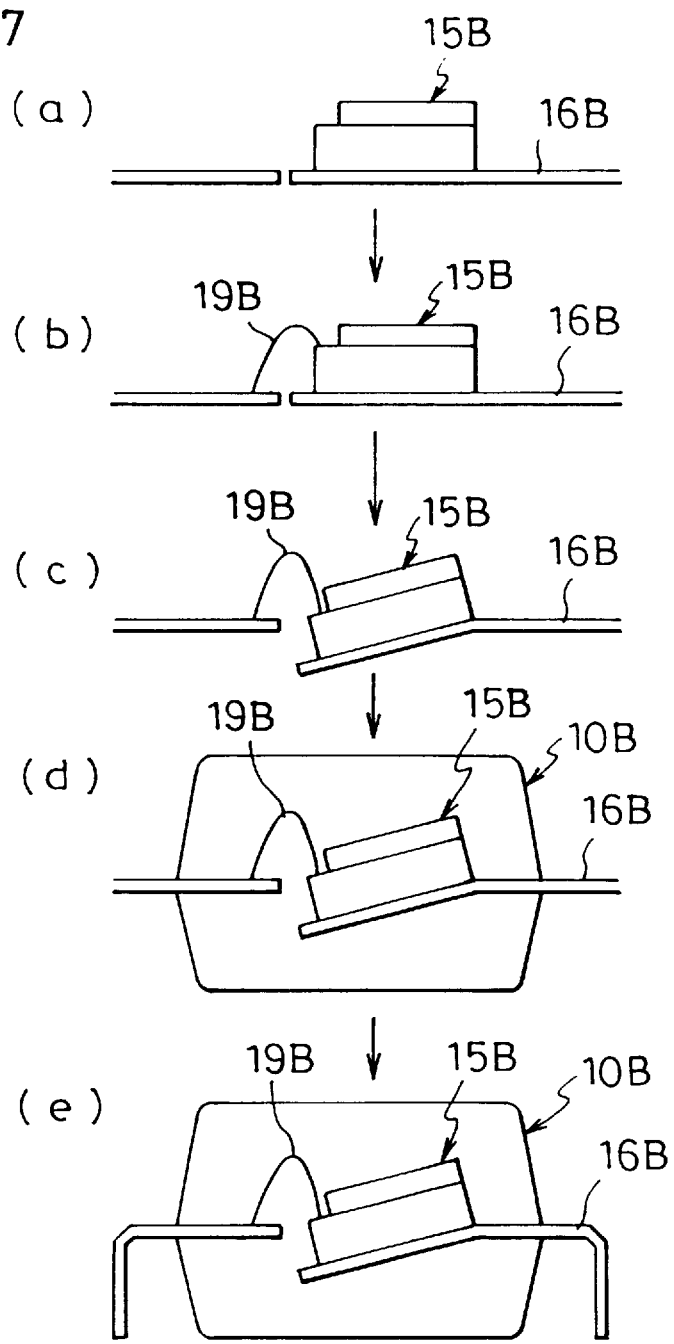
FIGS. 7(a) to 7(e) show in schematic sectioned views steps of a method for manufacturing the acceleration sensor device in the embodiment of FIG. 6 of the present invention.

The manufacture of such acceleration sensor device 10B shown in FIG. 6 may be performed in such manner as shown in FIG. 7, for example. More specifically, the acceleration sensor chip 15B is die-bonded to the main lead 16B of a metal-made, mostly by an iron series or copper series alloy. Then the wire-bonding is performed as shown in FIG. 7(b). Thereafter an external force is given to part of the main lead 16B at which the chip 15B is die-bonded, i.e., to the die-bond pad part, so as to deform the main lead 16B in a direction of bending down the wire-bond pad side of the acceleration sensor chip 15B down as shown in FIG. 7(c). A resin part of the premold package PM with a resin-sealing performed, and terminals are formed by cutting and bending exposed end parts of the main and second-pad side leads 16B and 17B as shown in FIG. 7(e). According to the embodiment of FIG. 6, the acceleration sensor chip and leads can be simultaneously molded, to be effectively contributive to the improvement in the productivity. In the embodiment of FIGS. 6 and 7, other arrangements than those in the above are the same as those in the embodiment of FIGS. 1A to 1C, and the same constituents as those in FIGS. 1A to 1C are denoted by the same reference numerals but with a suffix "B" added in FIGS. 6 and 7.

Figure 8:
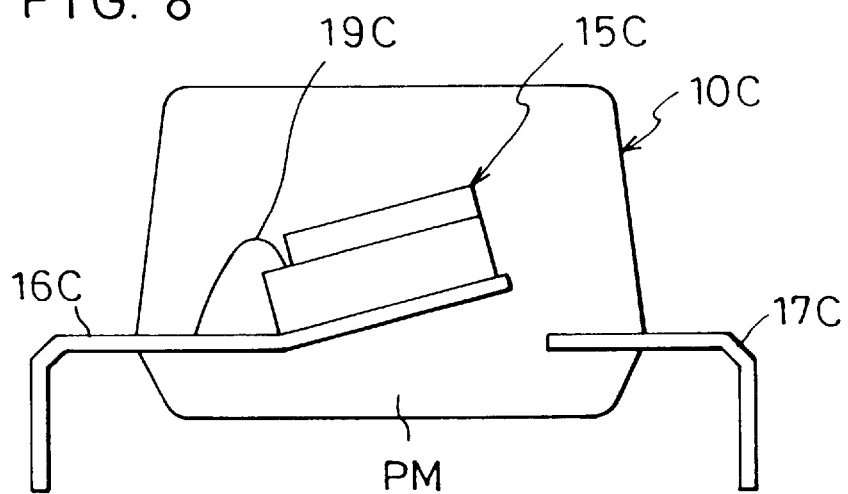
FIG. 8 is a schematic sectioned view of the acceleration sensor device in another embodiment according to the present invention.

When the second pad of the acceleration sensor chip 15C to be connected through the bonding wire 19C to the lead is disposed adjacent to the bent part of the main lead 16C, as shown in FIG. 8, the main lead 16C may be bent in a direction in which a part of the acceleration sensor chip 15C on a side opposite to the side having the wire bond pad is raised upward.

The acceleration sensor device 10C shown in FIG. 8 may be manufactured in such manner as shown, for example, in FIGS. 9(a) to 9(e). In this case, the only difference from the steps of FIGS. 7(a) to 7(e) is that, as shown in FIG. 9(c), the main lead 16C is bent so as to raise the side of the acceleration sensor chip 15C opposite to the side provided with the wire bond pad. All other arrangements in FIGS. 8 and 9 than those referred to above are the same as those in the embodiments of FIGS. 1 and 6, and the same constituents as those in FIGS. 1 and 6 are denoted in FIGS. 8 and 9 by the same reference numerals but with a suffix "C" added.

Figure 10:
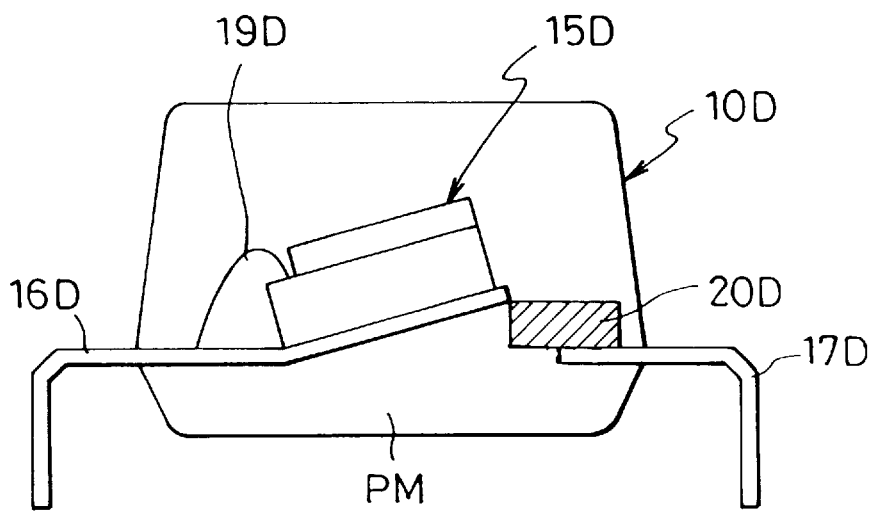
FIG. 10 is a schematic sectioned view of the acceleration sensor device in another embodiment according to the present invention.

In another embodiment shown in FIG. 10 of the present invention, a spacer 20D is disposed as held between the main lead 16D bent upward for tilting the acceleration sensor chip 15D and the lead 17D on the second-pad side, in the acceleration sensor device 10D. In this respect, the spacer 20D may be employed even in the event where the main lead 16D is bent in the direction shown in FIG. 6.

Figure 11:
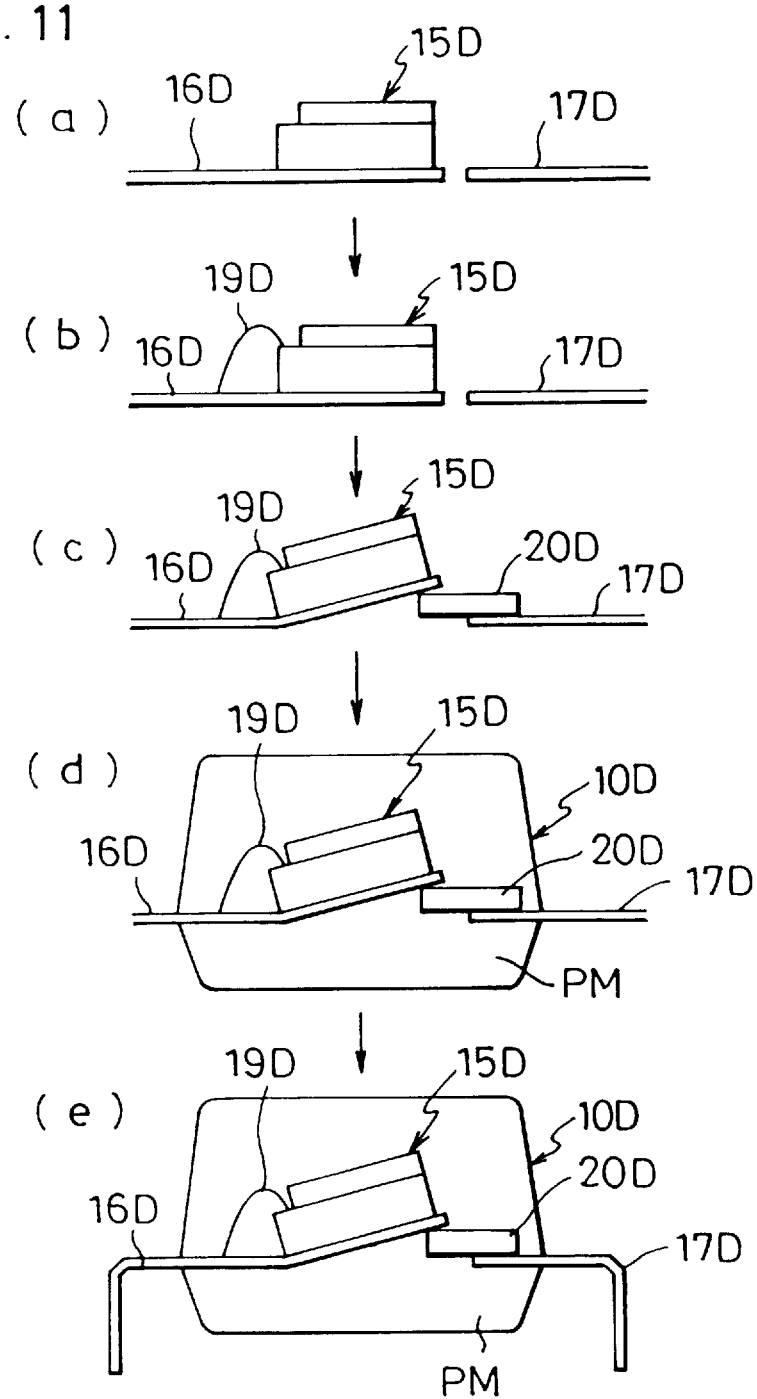
FIGS. 11(a) to 11(e) show in schematic sectioned views steps in one working aspect of the method for manufacturing the acceleration sensor device in the embodiment of FIG. 10 of the present invention.

The acceleration sensor device shown in FIG. 10 may be manufactured through such steps as shown in FIGS. 11(a) to 11(e), which steps differ from the steps shown in FIGS. 7(a) to 7(e) only in a step shown in FIG. 11(c) where the main lead 16D is bent with the spacer 20D held between part of the main lead 16D being bent and the other lead 17D being not bent. Other constituents and steps than those referred to in the above in the embodiment of FIGS. 10 and 11 are the same as those in the embodiments of FIGS. 1 and 6 and are denoted by the same reference numerals but with a suffix "D" added.

Figure 12:
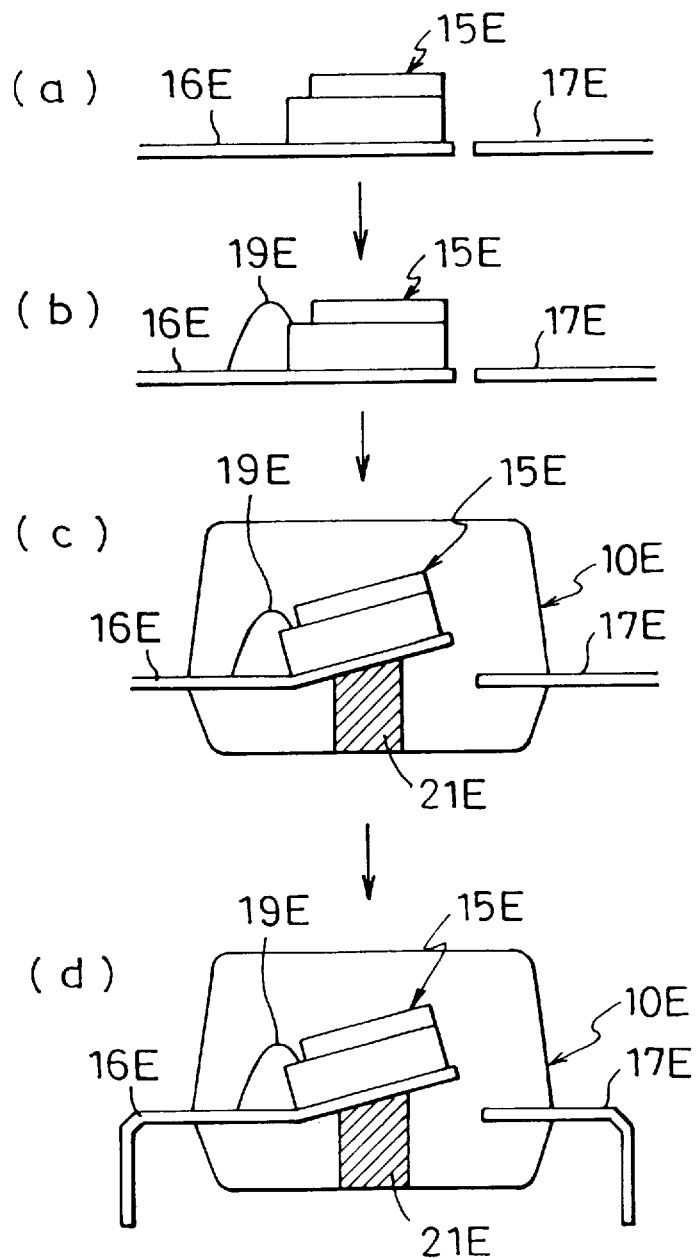
FIGS. 12(a) to 12(d) show in schematic sectioned views steps in another working aspect of the method for manufacturing the acceleration sensor device in the embodiment of FIG. 10.

In FIGS. 12(a) to 12(d), another embodiment of the method for manufacturing the acceleration sensor device according to the present invention is shown, in which the acceleration sensor chip 15E is die-bonded to the main lead 16E made of a metal (mostly iron series or copper series alloy) as shown in FIG. 12(a). The wire-bonding 19E is then performed as shown in FIG. 12(b). Thereafter the resin sealing is performed to form the package PM part acting also as the casing in a state where a projection 21E formed in a lower one of the transfer molding dies is engaged to a lower side of the bonding wire 19E of the acceleration sensor chip 15E on the main lead 16E to have the lead bent in a direction in which part of the main lead 16E on the other side than a side of the acceleration sensor chip 15E having the bonding wire 19E is raised upward as shown in FIG. 12(c), and then the exposed end parts of the leads 16E and 17E are cut and bent to form the terminals as shown in FIG. 12(d). Thereafter, preferably, a hole formed in the package part PM after removal of the dies may be filled with a resin, metal or the like.

Figure 13A:
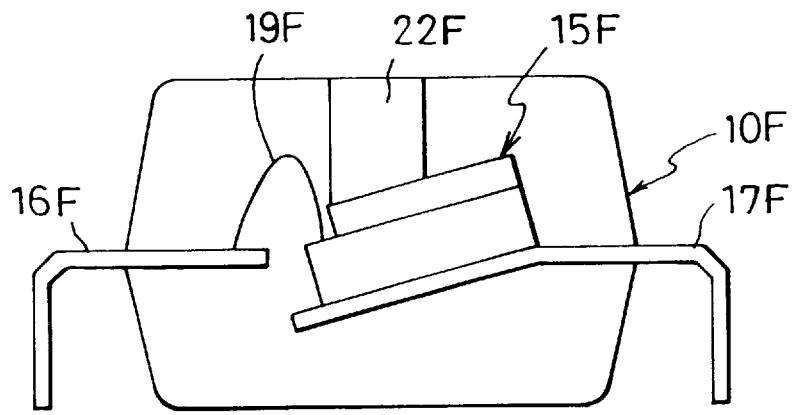
FIG. 13A is a schematic sectioned view of the acceleration sensor device in another embodiment according to the present invention.
Figure 13B:
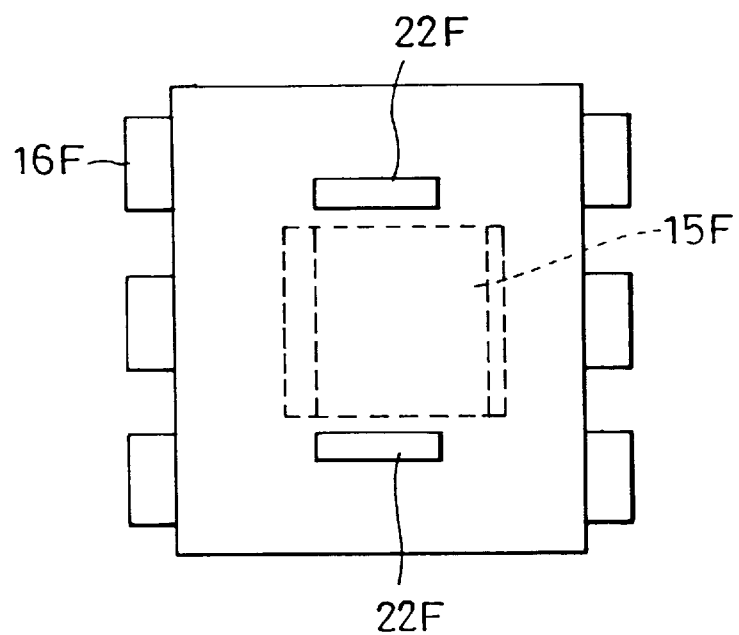
FIG. 13B is a plan view of the acceleration sensor device of FIG. 13A.

Further, as shown in a sectioned view of FIG. 13A and a top plan view of FIG. 13B, the projection 22F may be provided in upper die of the transfer molding dies to have the main lead 16F bent down as has been shown in FIG. 6. In this case, the manufacturing method is the same as that has been described with reference to FIG. 12.

Figure 14:
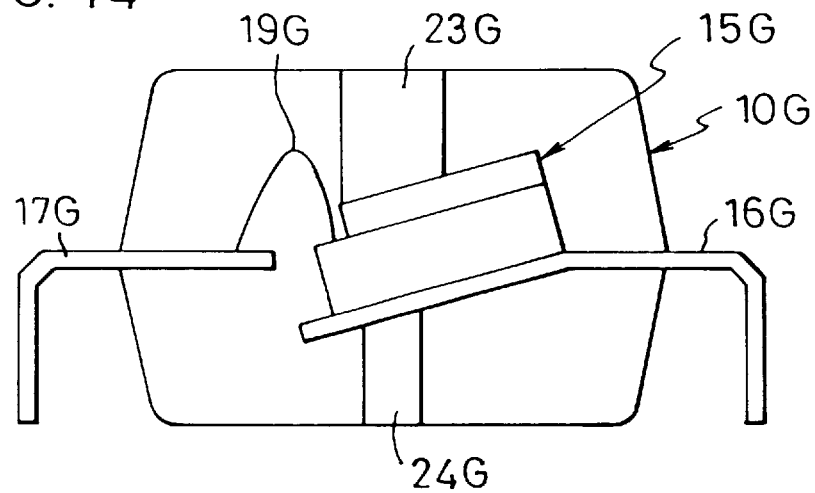
FIGS. 14 to 16 are schematic sectioned views of the acceleration sensor device in other embodiments respectively of the present invention.

It may be also possible to form both of the upper and lower dies of the transfer molding dies to have the projections for bending the main lead 17F as has been shown in FIG. 13A. In FIG. 14, an embodiment of the acceleration sensor device 10G prepared in such manner is shown, in which a hole is formed with the projection 23G of the upper molding die while a hole is formed by the projection 24G of the lower molding die. In the case of this manufacturing method, too, the arrangement is the same as that has been described with reference to FIG. 12.

Figure 15:
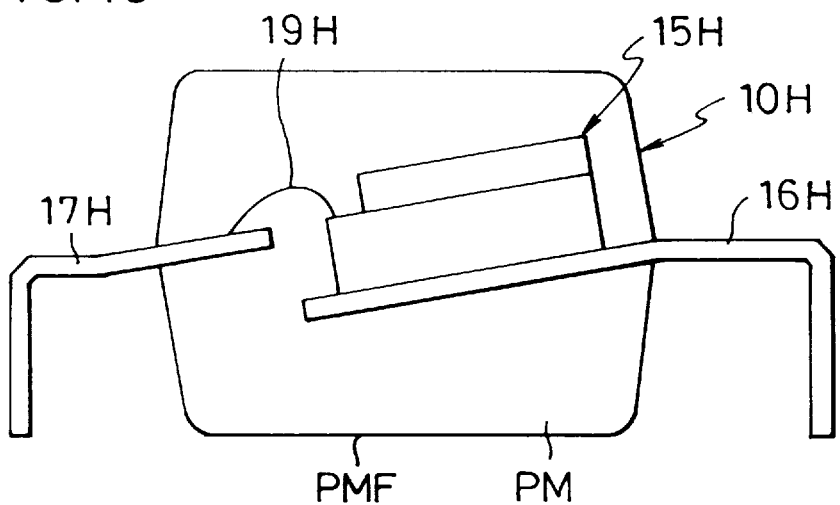

In another embodiment of the acceleration sensor device 10H of the present invention as shown in FIG. 15, the main lead 16H bent downward as in FIG. 13 with the acceleration sensor chip 15H mounted thereto is formed to have a height difference from the wire-bonded second-pad side lead 17H so that even the wire-bonded second pad side of the chip 15H will be higher, while the wire-bonded second pad side lead 17H is formed to be disposed substantially in the same plane (the same height) as the surface of the chip 15H to which the bonding wire is connected. In this case, the transfer molding dies are designed so that the configuration of the package body PM (i.e., the shape of the transfer molding dies) will have the package mounting surface PMF on the lower side of the package body PM which defines a predetermined angle with respect to the frame surface of the main lead 16H. With this arrangement, the acceleration sensor chip 15H is put in the state of being slanted by a predetermined angle with respect to the horizontal plane of the circuit board, when the acceleration sensor device 10H is mounted to the circuit board. Further, as a height difference between the wire-bonded second pad and the pad of the acceleration sensor chip 15H is minimized, it is possible to improve the reliability of the wire bonding. In the respective embodiments shown in FIGS. 10 to 15 of the present invention, other arrangements than the above described are the same as those in FIGS. 1 and 6, and the same constituents as those in FIGS. 1 and 6 are denoted by the same reference numerals but sequentially with each of suffixes "D", "E", "F", "G" and "H" added.

Figure 16:
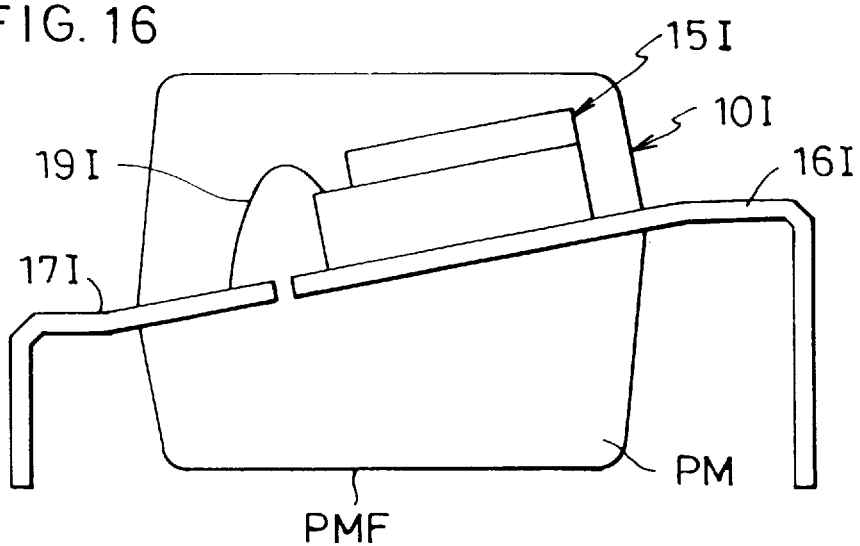
Figure 17:
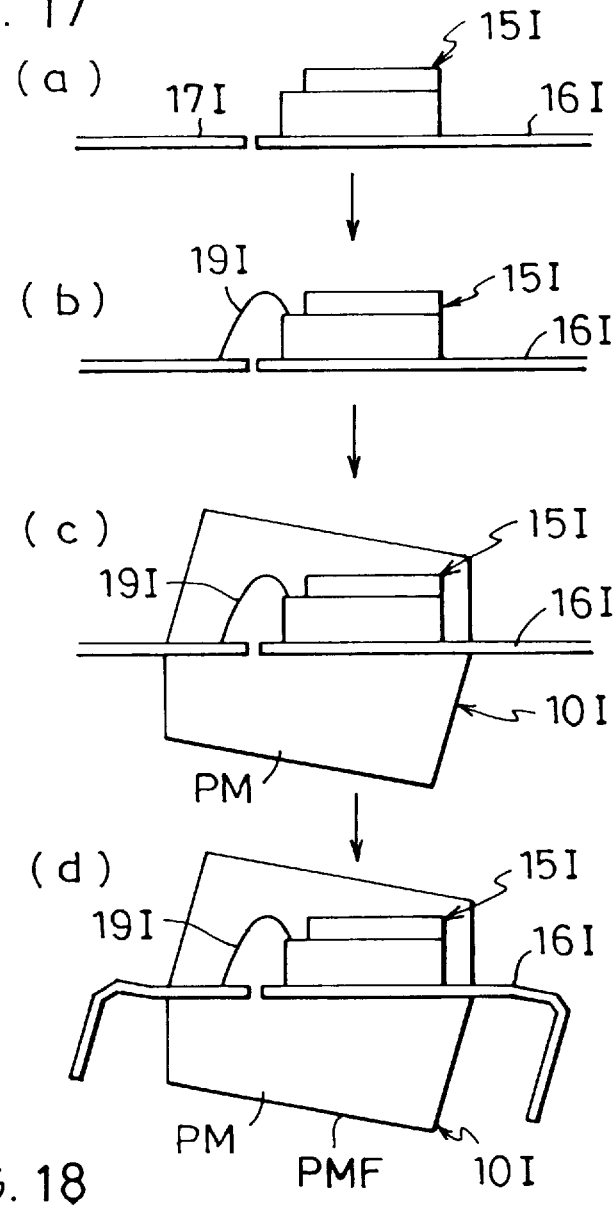
FIGS. 17(a) to 17(d) show in schematic sectioned views steps in one working aspect of the method for manufacturing the acceleration sensor device of FIG. 16 according to the present invention.

In another embodiment of the acceleration sensor device 10I of the present invention as shown in FIGS. 16 and 17, the acceleration sensor chip 15I is mounted on a planar main lead 16I, while the package mounting surface PMF with respect to the board on the bottom side of the package body PM is formed as slanted to define a predetermined angle with respect to the surface of the main lead 16I. In the arrangement of FIGS. 16 and 17, other constituents than those described above are the same as those in the embodiments of FIGS. 1 and 6, and are denoted by the same reference numerals as those in FIGS. 1 and 6 but with a suffix "I" added.

Figure 18:
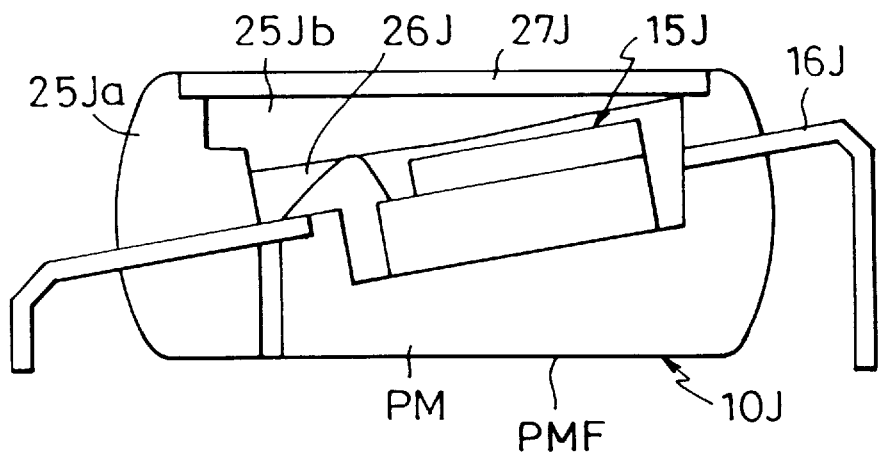
FIG. 18 is a schematic sectioned view of the acceleration sensor device according to the present invention.

In another embodiment of the acceleration sensor device 10J of the present invention as shown in FIG. 18, the acceleration sensor chip 15J is mounted onto a body part 25Ja of the package body PM formed to render the mounting surface of the main lead 16J to form a predetermined angle, i.e., to be slanted with respect to the package mounting surface PMF of the package body PM to the circuit board. The acceleration sensor device 10J further comprises a sealing resin 26J for sealing the acceleration sensor chip 15J, and a lid 27J for closing an opening of a recess 25Jb formed in the package body PM for disposing therein the acceleration sensor chip 15J.

Figure 19:
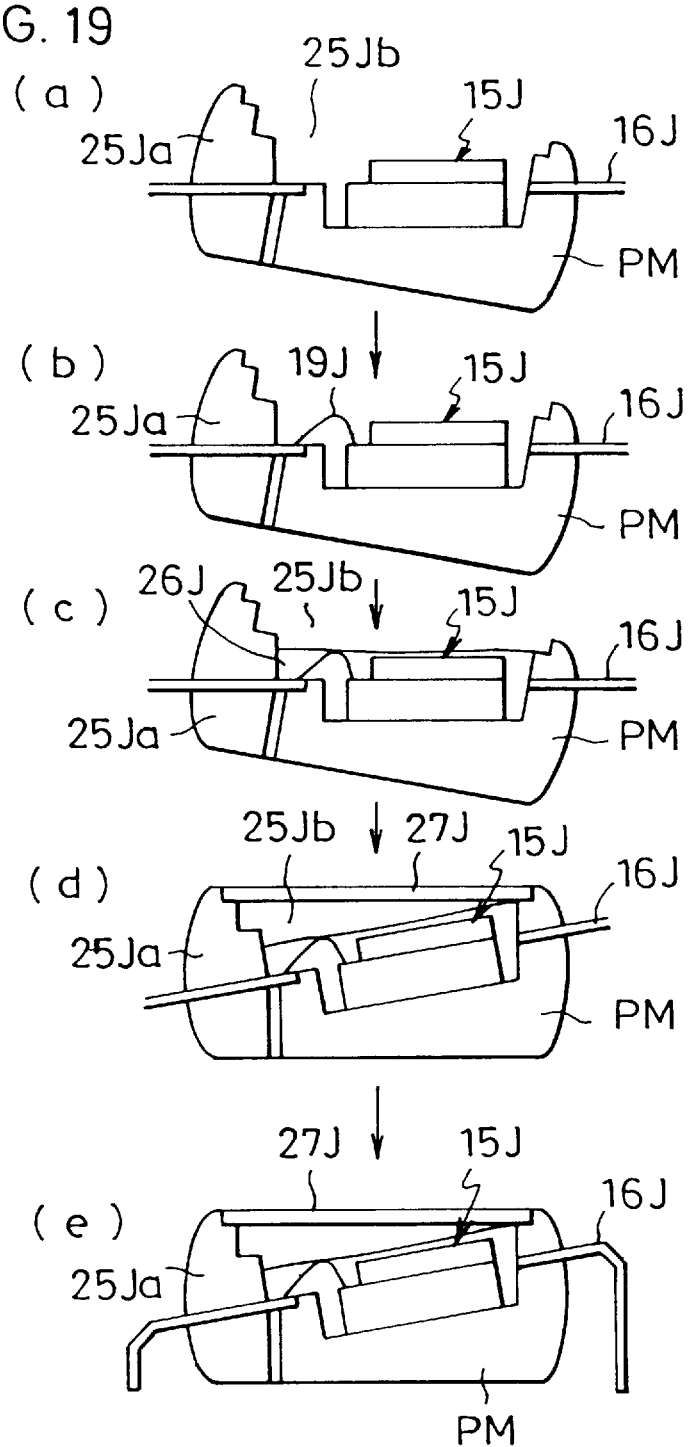
FIGS. 19(a) to 19(e) show in schematic sectioned views steps in one working aspect of the method for manufacturing the acceleration sensor device of FIG. 18 according to the present invention.

A working aspect of the steps for manufacturing the acceleration sensor device 10J of FIG. 18 is shown in FIGS. 19(a) to 19(e), in which, first as shown in FIG. 19(a), the acceleration sensor chip 15J is die-bonded to bottom surface in a recess 25Jb provided in the body part 25Ja of the package body PM with the main lead 16J simultaneously molded. Next, as in FIG. 19(b) the wire bonding is performed with the bonding wire 19J and, thereafter, as in FIG. 19(c), the acceleration sensor chip 15J within the recess 25Jb is sealed by the sealing resin 26J such as JCR or the like. Further, as shown in FIG. 19(d), the opening of the recess 25Jb is closed by means of the lid 27J, such as a nameplate or the like adhered. Finally, as shown in FIG. 19(e), the exposed ends of the lead 16J are cut and bent to form terminals. In the arrangement of FIGS. 18 and 19, other constituents than those described above are the same as those in FIGS. 1 and 6 and are denoted by the same reference numerals used in FIGS. 1 and 6 but with a suffix "J" added.

Figure 20:
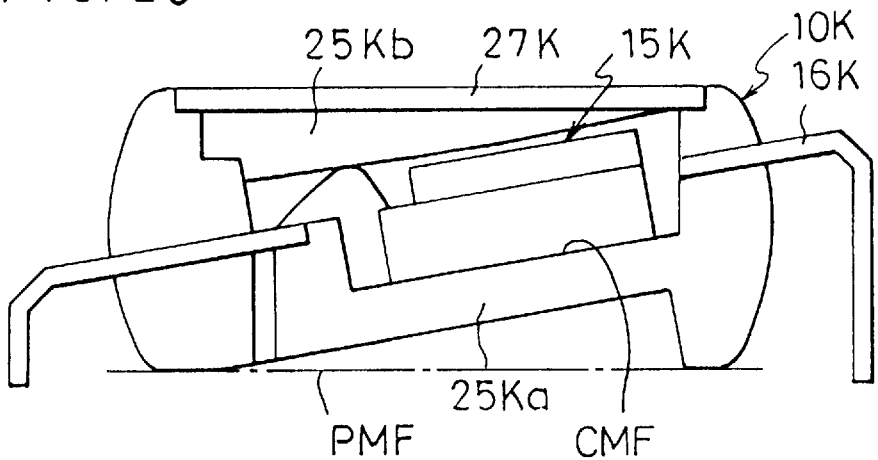
FIGS. 20 and 21 are schematic sectioned views showing other embodiments of the acceleration sensor device according to the present invention.

In another embodiment of the acceleration sensor device 10K according to the present invention as shown in FIG. 20, in contrast to the foregoing acceleration sensor device 10J shown in FIG. 18, the package mounting surface PMF of the body part 25K of the premold package, below the recess 25Kb in which the acceleration sensor chip 15K is mounted, is formed to be substantially parallel with the surface on which the sensor chip 15K is package mounted. The mounting surface PMF of the package body may be formed as shown in FIG. 20 by means of a spot facing, for example. In the arrangement of FIG. 20, other constituents than those described above are the same as those in the embodiments of FIGS. 1 and 6 and are denoted by the same reference numerals as those used in FIGS. 1 and 6 but with a suffix "K" added.

Figure 21:
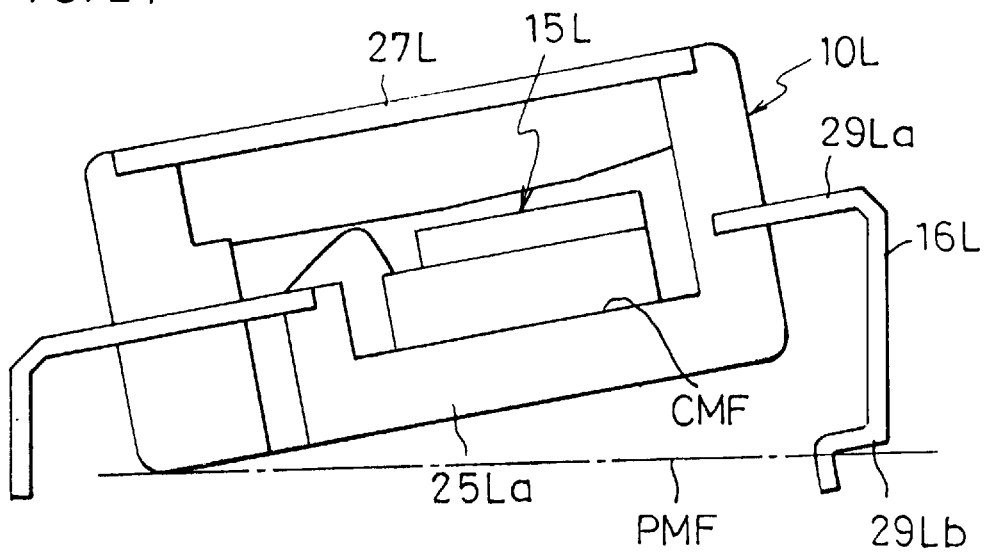
Figure 22:
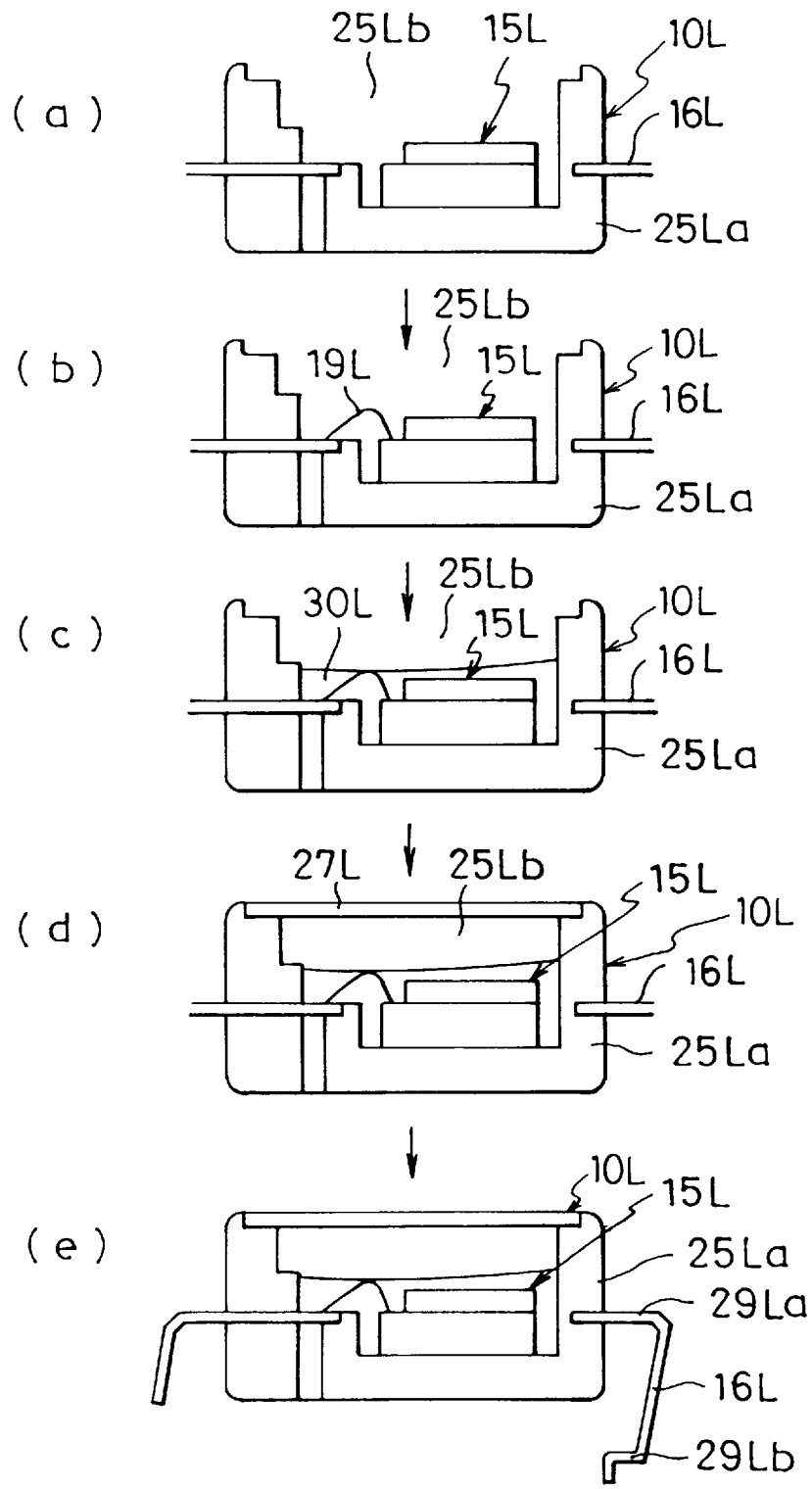
FIGS. 22(a) to 22(e) show in schematic sectioned views steps in one working aspect of the method for manufacturing the acceleration sensor device of FIG. 21 according to the present invention.

In another embodiment of the acceleration sensor device 10L according to the present invention as shown in FIGS. 21 and 22, the main lead 16L provided to the package body PM is formed to have a stepped bent part 29Lb at a longer extended end portion of substantially L-shaped body 29La of the main lead 16L, while the subsidiary lead 17L is also bent but not extended, so that, in the mounted state of the acceleration sensor device 10L, the piezoresistor and the center of gravity of the mass will be positioned substantially on the same horizontal plane, and the acceleration sensor chip 15L will be slanted with respect to the surface of the circuit board on which the device is mounted, by means of the respective tip ends of the stepped bent part 29Lb of the extended main lead 16L and of the non-extended subsidiary lead 17L. This acceleration sensor device 10L is manufactured such that, first as shown in FIG. 22(a), the acceleration sensor chip 15L is mounted onto bottom surface of the recess 25Lb in the body part 25La of the premold package PM having the main lead 16L simultaneously molded, then as shown in FIG. 22(b) the wire-bonding is performed, then as in FIG. 22(c) such sealing resin 30L as JCR or the like is supplied in the recess 25Lb, and as in FIG. 22(d) such lid 27L as the nameplate is secured to the opening of the recess 25Lb. Finally, as shown in FIG. 22(e), the leads 16L and 17L formed as in the above are cut and bent to form the terminals.

Figure 23:
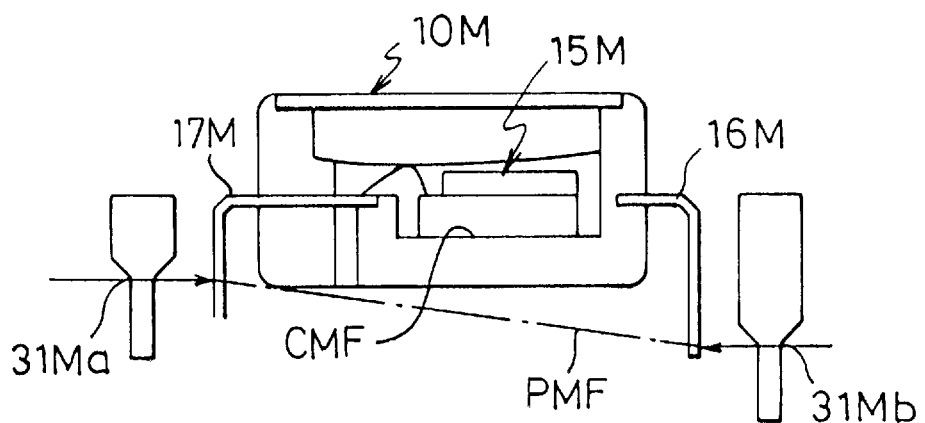
FIGS. 23 and 24 are schematic sectioned views showing other embodiments of the acceleration sensor device according to the present invention.

Instead of the extended and stepped bent part 29Lb, of the main lead 16L such terminal stand-off parts 31Ma and 31Mb as shown in FIG. 23 are formed respectively at the bent but non-extended end part of the subsidiary lead 17M and at the bent and extended end part of the main lead 16M, so that the acceleration sensor chip 15M can be slanted with respect to the surface of the circuit board (shown a dashed line PMF) on which the sensor device is mounted. In the arrangements of FIGS. 21–23, other constituents than those described above are the same as those in the embodiments of FIGS. 1 and 6 and are denoted by the same reference numerals as those used in FIGS. 1 and 6 but with the suffixes "L" and "M" added, respectively.

Figure 24:
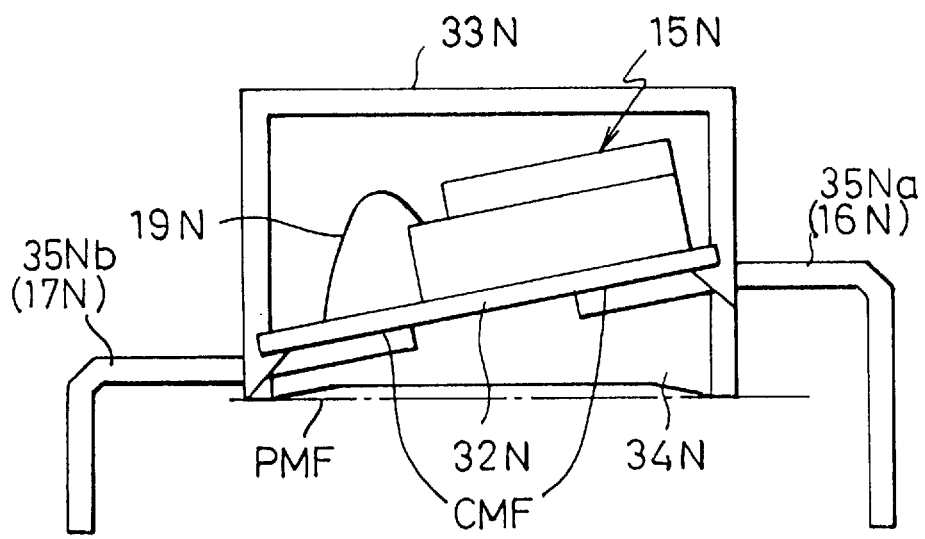

In another embodiment of the acceleration sensor device 10N as shown in FIG. 24, the acceleration sensor chip 15N is mounted onto a printed circuit board 32N which is secured in a sealing frame 33N for holding the printed circuit board 32N as slanted at a predetermined angle, and the chip is sealed in the frame by means of a potting resin sealing with a sealing resin 34N.

Figure 25:
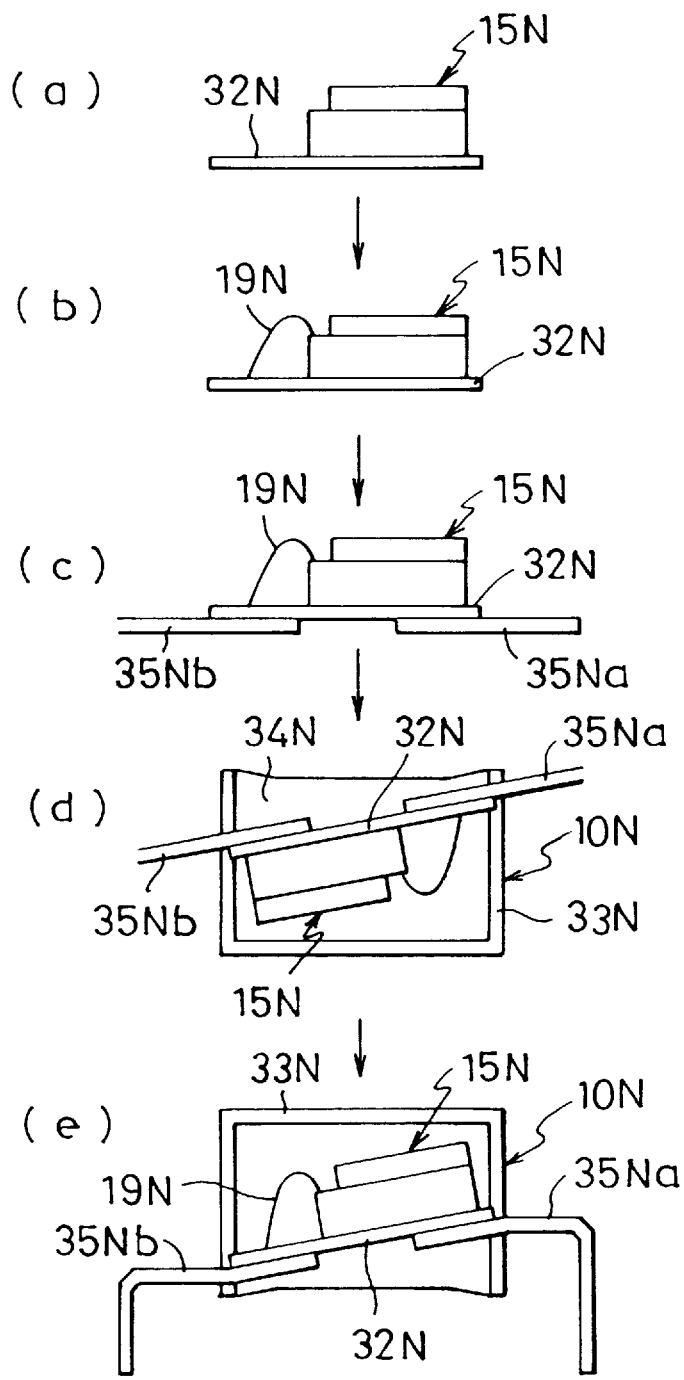
FIGS. 25(a) to 25(e) show in schematic sectioned views steps in one working aspect of the method for manufacturing the acceleration sensor device of FIG. 24 according to the present invention.

A working aspect of the method for manufacturing the acceleration sensor device 10N of FIG. 24 is shown in FIG. 25, in which, first as shown in FIG. 25(a) the acceleration sensor chip 15N is mounted to the printed-circuit board 32N, the bonding wire 19N is then provided as in FIG. 25(b), terminals 35Na and 35Nb are connected to the printed-circuit board 32N as shown in FIG. 25(c), the printed-circuit board 32N is mounted to the interior of the sealing frame 33N as slanted at the predetermined angle as shown in FIG. 25(d), and the sealing is made with the sealing resin 34N. Finally, the terminals 35Na and 35Nb are cut and bent. Other constituents than those described above in the arrangement of FIGS. 24 and 25 are the same as those in the embodiments of FIGS. 1 and 6 and are denoted by the same reference numerals as those used in FIGS. 1 and 6 but with a suffix "N" added.

Figure 26:
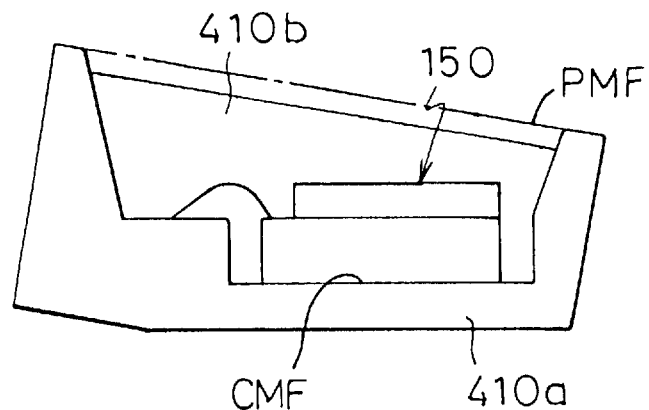
FIGS. 26 and. 27 are schematic sectioned views showing other embodiments of the acceleration sensor device according to the present invention.
Figure 27:
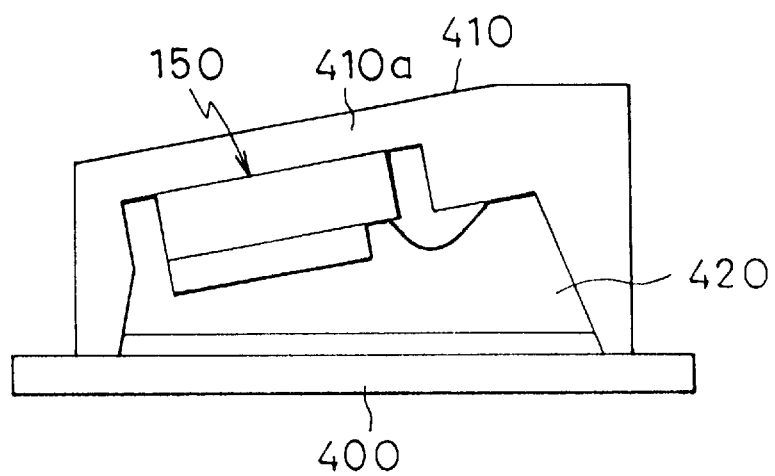
Figure 28:
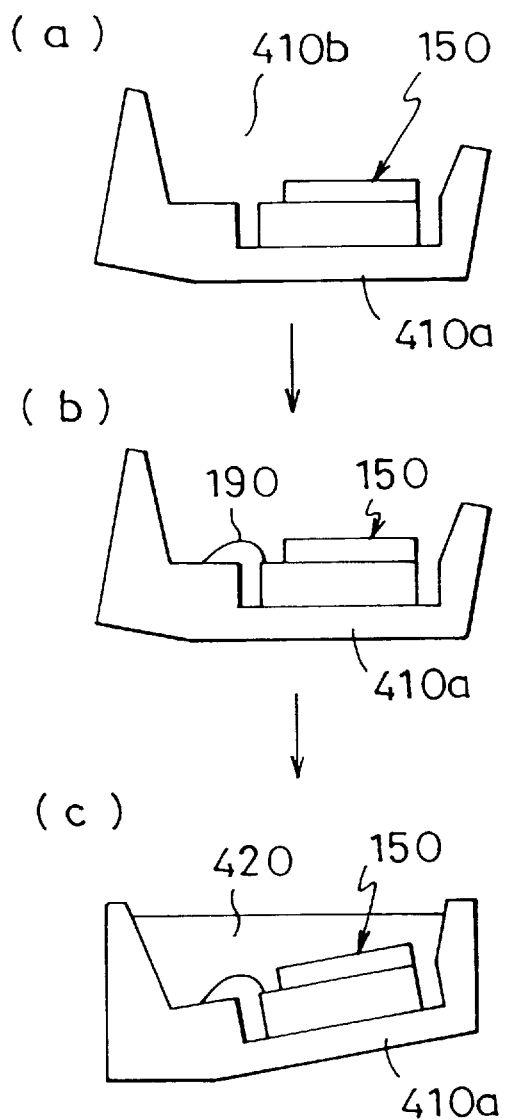
FIGS. 28(a) to 28(c) show in schematic sectioned views steps in one working aspect of the method for manufacturing the acceleration sensor device of FIG. 27 according to the present invention.

In another embodiment of the acceleration sensor device as shown in FIGS. 26 and 27, the acceleration sensor chip 15O is mounted in the interior of a recess 41Ob in a three-dimensional molding part 41Oa acting also as the casing, and the mounting surface of the acceleration sensor chip 15O to the three-dimensional molding part 41Oa is slanted by a predetermined angle with respect to the package mounting surface PMF of the part 41Oa to the printed-circuit board. The acceleration sensor device 10O shown in FIG. 26 is manufactured through such steps as shown, for example, in FIGS. 28(a) to 28(C). As shown first in FIG. 28(a), the acceleration sensor chip 15O is mounted onto the bottom surface of the recess 41Ob of the three-dimensional molding part 41Oa. Thereafter, as shown in FIG. 28(b), the wire-bonding is performed with the wire 19O, and, as in FIG. 28(c), the acceleration sensor chip 15O is sealed within the recess 41Ob with the sealing resin 42O supplied therein. In the arrangement of FIGS. 26 and 27, other constituents than those described above are the same as those in the embodiments of FIGS. 1 and 6 and are denoted by the same reference numerals as those used in FIGS. 1 and 6 but with a suffix "O" added.

Figure 29:
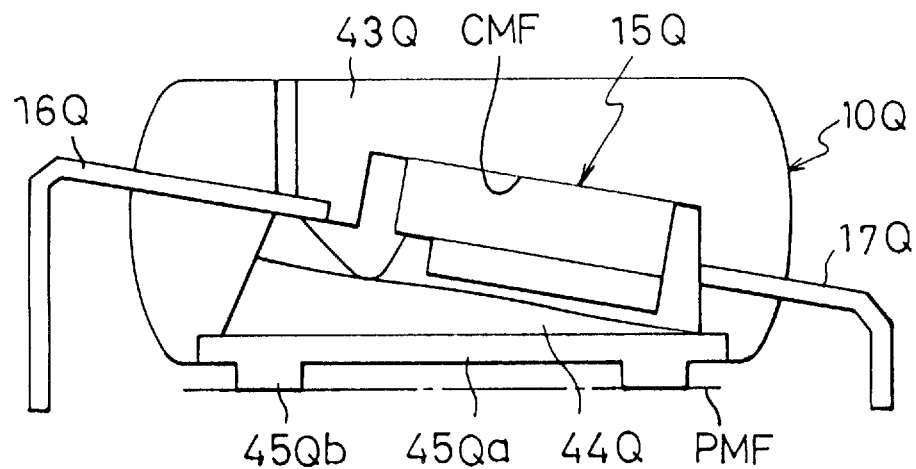

In still another embodiment of the acceleration sensor device of the present invention as shown in FIG. 29, the acceleration sensor chip 15Q is mounted to the body part 43Q of the package body PM of which the frame surface of the main lead 16Q is slanted at the predetermined angle, and the opening of the recess 44Q of the body part 43Q is closed by a lid 45Qa. On outer surface of the lid 45Qa forming the package mounting surface PMF with respect to the board, there are provided a plurality of projections 45Qb for precisely attaining the parallelism between the board and the acceleration sensor device. In the arrangement of FIG. 29, other constituents than those described above are the same as those in the embodiments of FIGS. 1 and 6 and are denoted by the same reference numerals as those used in FIGS. 1 and 6 but with a suffix "Q" addded.

Figure 30:
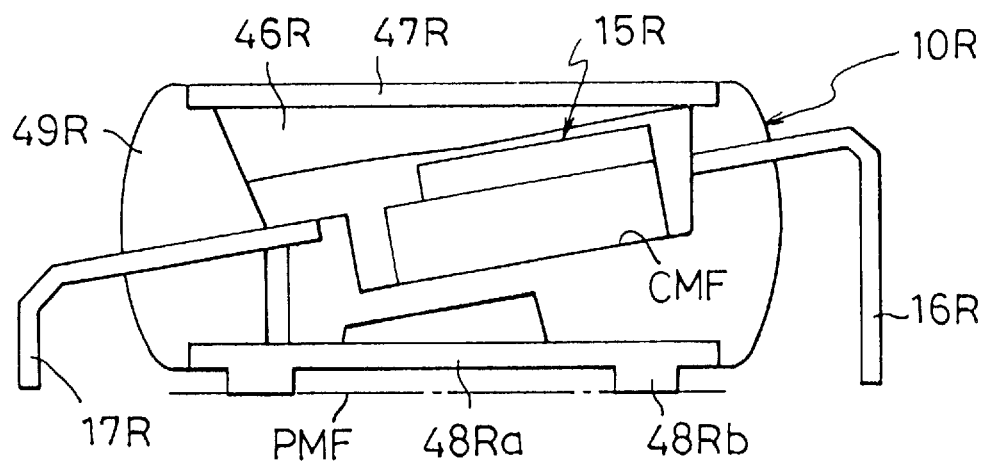

In another embodiment of the acceleration sensor device of the present invention as shown in FIG. 30, in contrast to the acceleration sensor device having the projections 45Qb for the parallelism and provided to the outer surface of the lid 45Qa forming the mounting surface PMF, the sensor device comprises a plate 48Ra having projections 48Rb and mounted to the package body 49R on the side to be mounted to the board opposite to the side having the recess 46R, separately from the lid 47R for closing the recess 46R in which the acceleration sensor chip 15R is disposed. The surface on the side of the package mounting surface PMF of the package body PM on which the plate 48Ra is to be mounted may be one which is cut by means of the spot facing or the like for promoting the temperature rise by means of the wire bonding heater, as has been shown in FIG. 20. In the arrangement of FIG. 30, other constituents than those described above are the same as those in FIGS. 1 and 6, and are denoted by the same reference numerals as those used in FIGS. 1 and 6 but with a suffix "R" added.

In another embodiment of the acceleration sensor device 10S of the present invention as shown in FIGS. 31 and 32, in contrast to the acceleration sensor device of FIG. 29 having the projections 45Qb for the parallelism between the board and the sensor device 10S and provided to the lid 45Qa to be mounted to the body 43Q of the package body PM, the projections 50Sb or 51Sb for the parallelism are provided to the body part 50Sa or 51Sa of the package body PM. In this event, the acceleration sensor device 10S of FIG. 31 is provided with the recess on the side of the mounting surface with respect to the board, while the acceleration sensor device 10S of FIG. 32 is provided with the recess on the side opposite to the mounting surface with respect to the board.

In the acceleration sensor device 10S shown in FIG. 31, further, a stepped part 50Sc is formed over the entire peripheral edge of the recess in the package body PM for securing as adhered thereto the lid to the body part 50Sa, and the projections 50Sb are required to be formed on outer side of the stepped part 50Sc which is substantially annular in plan view, so that the sensor device 10S will be apt to be enlarged in outer shape. As shown in FIG. 33, therefore, it is possible to minimize the size of the acceleration sensor device to reduce occupying area on the board by means of a body part 52Sa for the package body PM with any stepped part eliminated, and of a lid 53S having notches for receiving the projections 52Sb, and 52Sc the lid 53S being thus fitted between the projections 52Sb and 52Sc. In the arrangements of FIGS. 31 to 33, other constituents than those described above are the same as those in the embodiments of FIGS. 1 and 6 and are denoted by the same reference numerals but with a suffix "S" added.

In the foregoing acceleration sensor devices of the respective embodiments, design modification will be possible in various ways. In particular, the respective embodiments have been described as employing the piezoresistor, but it should be readily appreciated by the one skilled in the art that an electrostatic capacity means is employable while certain extent of design modification is called for.

What is claimed is:

1. An acceleration sensor device comprising:
   an acceleration sensor chip including a mass, a beam for supporting said mass in cantilevered structure, and a piezoresistor provided on said beam;
   a printed-circuit board on which said acceleration sensor chip is mounted; and
   a sealing frame for sealing therein said printed-circuit board with said acceleration sensor chip mounted thereon,
   said sealing frame being formed to secure said printed-circuit board as slanted for positioning said piezoresistor of the acceleration sensor chip and the center of gravity of said mass substantially on the same horizontal plane in mounting state of the acceleration sensor device.

2. An acceleration sensor device comprising:
   an acceleration sensor chip including a cantilevered structure of a mass and a beam, and an acceleration detecting means provided on said beam;
   main and subsidiary leads respectively electrically connected to the acceleration detecting means and disposed substantially on the same plane as the beam for providing an output signal corresponding to the acceleration detected by the detecting means; and
   a package body holding said acceleration sensor chip and main and subsidiary leads, said package body being provided with a package mounting surface at which the package body is to be mounted to an associated device-mounting object, and with a chip mounting surface on which the acceleration sensor chip is mounted in a posture slanted with respect to the package mounting surface so as to position the acceleration detecting means as well as the center of gravity of the mass of the acceleration sensor chip substantially on the same horizontal plane in mounted state of the package body to the device-mounting object.

3. The acceleration sensor device according to claim 2 wherein said chip mounting surface comprises one side surface of said main lead which is bent to be in said slanted posture with respect to said package mounting surface, and said package body comprises a plastic molding formed to integrally hold the acceleration sensor chip and main and subsidiary leads and to have said package mounting surface on bottom side.

4. The sensor device according to claim 3 wherein said acceleration detecting means comprises a layer of piezoresistor formed on said beam of the acceleration sensor chip.

5. The sensor device according to claim 2 wherein said acceleration detecting means comprises a layer of piezoresistor formed on said beam of said acceleration sensor chip, and said package body comprises a plastic molding formed to have said chip mounting surface on one side and said package mounting surface on the other side.

6. The sensor device according to claim 5 wherein said package mounting surface is formed on bottom side of said plastic molding, and said bottom side has a recess providing a surface parallel with said chip mounting surface on topside of the molding.

7. The sensor device according to claim 5 wherein said package mounting surface is provided with a projection for attaining a parallel relationship between the package mounting surface of the device and a mounting surface of said associated device-mounting object.

8. The sensor device according to claim 7 wherein said package body includes on said one side a recess in which said acceleration sensor chip is disposed and a lid for covering said recess to protect the sensor chip therein, and said projection is provided for positioning said lid.

9. The sensor device according to claim 5 wherein said subsidiary lead is disposed, on second pad side thereof, to be substantially in the same plane as said piezoresistor layer of the sensor chip to which the subsidiary lead being connected through a bonding wire.

10. The sensor device according to claim 5 wherein said package mounting surface of said plastic molding is formed to be slanted with respect to said chip mounting surface, for said positioning of said layer of piezoresistor and the center of gravity of said mass substantially on the same plane in the state where the device is mounted to the device-mounting means with the package mounting surface engaged to the device-mounting object.

11. The sensor device according to claim 5 wherein said acceleration sensor chip and said main lead are simultaneously molded.

12. The sensor device according to claim 2 wherein said package body comprises a plastic molding formed to have said package mounting surface on one side and a recess made in the package mounting surface, a bottom surface of said recess forming said chip mounting surface slanted with respect to the package mounting surface, and the other side of said molding being substantially parallel to the chip mounting surface as separated therefrom by a predetermined space.

13. The sensor device according to claim 5 wherein said main lead is provided with a stepped part at an extended end portion.

* * * * *